(12) United States Patent
Adams et al.

(10) Patent No.: US 6,175,499 B1
(45) Date of Patent: Jan. 16, 2001

(54) HEAT SINK CLAMPING STRING ADDITIONALLY HOLDING A ZIF SOCKET LOCKED

(75) Inventors: Stuart Thomas Adams, Charlotte, NC (US); William Vincent Cranston, III, Boca Raton, FL (US); Will Eugene Hamel, Parkland, FL (US); Jochem K. Koenig, Charlotte, NC (US); John E. McCloskey, Boca Raton, FL (US)

(73) Assignee: International Business Machines Corporation, Armonk, NY (US)

( * ) Notice: Under 35 U.S.C. 154(b), the term of this patent shall be extended for 0 days.

(21) Appl. No.: 09/510,615

(22) Filed: Feb. 22, 2000

Related U.S. Application Data

(62) Division of application No. 09/037,093, filed on Mar. 9, 1998, now Pat. No. 6,118,659.

(51) Int. Cl.⁷ ........................................................ H05K 7/20
(52) U.S. Cl. ............................. 361/704; 24/296; 257/727; 439/487
(58) Field of Search .................................... 267/150, 158, 267/160; 439/485, 487; 24/546, 296, DIG. 10; 248/505, 510; 257/718, 719, 727; 361/687, 697, 703, 704, 709, 710, 717–719, 722

(56) References Cited

U.S. PATENT DOCUMENTS

| | | | |
|---|---|---|---|
| 4,716,494 | * | 12/1987 | Bright . |
| 5,307,239 | * | 4/1994 | McCarty . |
| 5,386,338 | * | 1/1995 | Jordan . |
| 5,448,449 | * | 9/1995 | Bright . |
| 5,464,054 | * | 11/1995 | Hinshaw . |
| 5,519,574 | * | 5/1996 | Kodama . |
| 5,579,205 | * | 11/1996 | Tustaniwskyj . |
| 5,581,442 | * | 12/1996 | Morosas . |
| 5,590,025 | * | 12/1996 | Clemens . |
| 5,594,624 | * | 1/1997 | Clemens . |
| 5,671,118 | * | 9/1997 | Blomquist . |

* cited by examiner

*Primary Examiner*—Gerald Tolin
(74) *Attorney, Agent, or Firm*—Ronald V. Davidge; Richard A. Tomlin

(57) ABSTRACT

The locking member of a ZIF socket, which is movable between a locked position, in which high contact forces are present between contact springs within the socket and pins extending from an electronic module into the socket, and an unlocked position, in which the pins are released from the contact springs, is held in the locked position by means of a portion of a clamping spring inserted into a gap between the locking member and a portion of the housing of the ZIF socket. The clamping spring also holds a heat sink in place on the electronic module.

3 Claims, 2 Drawing Sheets

HEAT SINK CLAMPING STRING ADDITIONALLY HOLDING A ZIF SOCKET LOCKED

This application is a division of application, Ser. No. 09/037,093, filed Mar. 9, 1998, now U.S. Pat. No. 6,118,659 for which the issue fee has been paid.

BACKGROUND OF THE INVENTION

1. Field of the Invention

This invention relates to a resilient clip holding a heat sink in place against an electronic package within a socket, while simultaneously holding a movable portion of the socket in a locked position, with engagement forces retained between contacts within the socket and pins descending from the electronic package.

2. Background Information

Developments in integrated circuits have resulted in greater circuit density and complexity, increasing the number of pins necessary to connect power and signal lines between an electronic package and the circuit board to which it is attached, and increasing the heat generated by operation of an integrated circuit within the electronic package. These changes in integrated circuits have in turn resulted in increased needs for LIF (Low Insertion Force) and ZIF (Zero Insertion Force) sockets into which electronic packages are inserted, and in increased needs for heat sinks clamped to outer surfaces of electronic packages. The insertion force is the force required to plug the electronic package into a socket, typically arising from the deflection and friction forces acting between the individual pins descending from the electronic package and individual contact springs within the socket. Seating a high pin-count electronic package in a socket without the LIF or ZIF feature can require a force of over 250 pounds.

A ZIF feature is conventionally achieved, within a socket having an array of holes into which the pins descending from an electronic package are inserted, through the use of a sliding locking member operating on the module pins or contact springs within the socket, so that, when the sliding member is in an unlocked position, the pins can be inserted through these holes without contact with the contact springs, or with minimal contact with these springs. As the sliding member is subsequently moved into its locked position, the contact springs exert high contact forces on the pins from the electronic package. These contact forces are used both to provide for the passage of electrical signals between the individual pins and contact springs and to hold the electronic package in place on the socket.

A heat sink is conventionally clamped atop a high-density electronic package by means of a clamping spring extending upward from the socket into which the electronic package is plugged. A thermally conductive grease aids in the transfer of heat from the electronic package to the heat sink. Heat is dissipated from the heat sink into the surrounding air by means of a number of pins or fins extending outward as a part of the heat sink. A suitable force between the electronic package and the heat sink is maintained by the clamping spring. Many of the high-density pluggable electronic modules requiring a ZIF socket, due to a high pin count, also require this kind of a heat sink for proper operation.

Computing devices are being increasingly used in environments, such as manufacturing environments, including relatively high levels of mechanical shock and vibration. It has been determined that, during operation in such an environment, the detent mechanism used to hold the sliding member within the ZIF socket in its closed position is sometimes inadequate, allowing the sliding member to be moved by shock and vibration from its locked position toward its unlocked position. This movement causes the failure of signal transmission as the forces are reduced between individual spring contacts within the socket and individual pins from the electronic module, and conceivably loosens the electronic module from the socket.

Thus, what is needed is a positive method for positively holding the sliding member in its closed position. Preferably, such a method can accomplish this objective without increasing part count or assembly complexity by performing this latching function as a heat sink is clamped in place atop the electronic module.

DESCRIPTION OF THE PRIOR ART

U.S. Pat. No. 5,448,449 appears to show, without describing, a method for preventing movement of the sliding member within a ZIF socket. The ZIF socket apparently includes a sliding member operated by pivoting a lever through a 90-degree angle. The heat sink, which is substantially larger in area than the electronic module, is mounted to overextend the lever. Thus the lever must be rotated downward, apparently closing or locking the ZIF connector, before the heat sink is placed on the electronic package. With the heat sink clamped in place on the electronic module, the lever cannot be rotated upward to open or unlock the ZIF connector.

This patent describes a heat sink retainer including a clip having a pair of spaced-apart beams extending within the grooves between fins of the heat sink. The beams are resiliently deflected in respective planes extending parallel to the fins. One end of the clip is engaged beneath a first ledge on one side of the socket, while the opposite end of the clip is pivotally coupled to a latch. The latch is engaged beneath a second ledge on an opposite side of the socket, upon deflection of the beams in their respective planes. The clip assembly biases the heat sink toward the socket when the one end of the clip and the latch are engaged beneath the first and second ledges. A toggle coupled between the clip and the latch is movable between open and closed positions to engage and disengage the latch with the second ledge. The toggle has an overcenter position corresponding to the closed position such that a force must be applied to the toggle to move the toggle from the closed to the open position.

However, this method for holding the ZIF connector closed lacks general applicability. This method requires the presence of a pivoting lever extending upward from the ZIF connector when the connector is open. Many ZIF connectors do not have this feature. Furthermore, this method uses additional space, which is often not available on a circuit board to which a high-density electronic package is attached. The extra space is required on a first side of the socket for the lever itself and for the overextending portion of the heat sink, on a second side extending from the first side for the lever pivot and for a cam mechanism converting the pivoting motion of the lever to lever to operation of the ZIF mechanism, and on a side opposite the second side for the latch and toggle mechanism of the clip assembly.

Thus, what is needed is a mechanism for holding a ZIF connector closed without relying on the presence of an upward-pivoting lever and without requiring substantial space around the electronic module.

A number of U.S. patents describe spring clips for holding heat sinks in place atop circuit modules without addressing the problem of holding a ZIF connector closed. For example, U.S. Pat. No. 5,486,981 describes a spring clip for holding a heat sink in place, with one end of the spring clip being formed into the shape of lever or rocket arm so that heat sink can be attached or removed without the use of tools. U.S. Pat. No. 5,594,624 describes a strap spring mounting a heat sink to an electronic device by snapping holes in a leg over ears of a catch on the socket. Two perpendicularly extending spring have an opening between them so that the spring fit between the fins of a heat sink and are latched in ratchet indentations. U.S. Pat. No. 5,579,205 describes the attachment of a heat sink to an electronic package which is soldered in place on a circuit card, using a frame having legs with lower lips extending between the electronic package and the circuit card.

U.S. Pat. No. 5,602,719 describes a socket having an upper frame which is pivotally connected along an edge to the base of the socket. The electronic module moves with the upper frame, with its pins being moved into and out of contact with contact springs within the base. A heat sink is fastened to the electronic package by means of a spring clip, with one end of the spring clip being clipped onto the base of the socket near the pivotal connection to the upper frame, and with the other end of the spring clip being clipped onto the end of the upper frame opposite the pivotal connection. The spring clip does not hold the upper frame in its closed position; instead it provides a handle which can be used for opening the upper frame to remove the electronic package.

SUMMARY OF THE INVENTION

In accordance with one aspect of the present invention, there is provided electronic apparatus including a circuit module, a socket, a heat sink, and a clamping spring. The circuit module includes an upper surface, a lower surface, and a number of pins descending from the lower surface. The socket has a housing with a number of cavities into which the pins of the circuit module extend, a contact spring adjacent each such pin, and a locking member movable between a locked position and an unlocked position. The locking member includes a first surface adjacent a portion of the housing, which in turn includes a second surface adjacent the first surface of the locking member. In response to movement of the locking member into the locked position, with a gap being opened between the first and second surfaces, a contact force is exerted on each pin in the number of pins by the contact spring adjacent to the pin. In response to movement of the locking member into the unlocked position, with the gap between the first and second surfaces being closed, the contact force exerted on each pin within the number of pins is reduced. The heat sink extends adjacent the upper surface of the circuit module. The clamping spring holds the heat sink against the upper surface of the circuit module. The clamping spring includes an interposing portion extending into the gap opened between the first and second surfaces with the locking member in the locked position, to prevent motion of the locking member into the unlocked position.

DETAILED DESCRIPTION

Figure 1:
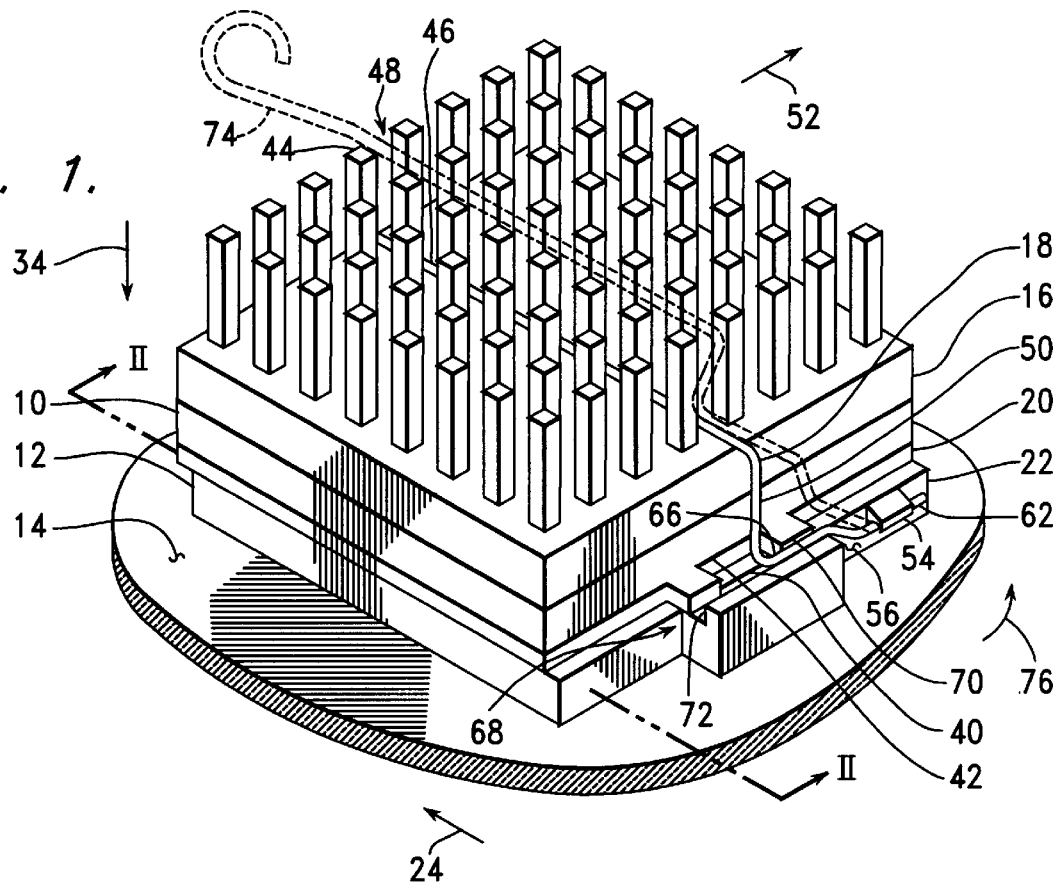
FIG. 1 is an isometric view of electronic apparatus built in accordance with the present invention, as viewed from above, to the right, and in front.

FIG. 1 is an isometric view of electronic apparatus built in accordance with the present invention, as viewed from above, to the right, and in front. This apparatus includes an electronic module 10, which is plugged into a ZIF socket 12. The ZIF socket 12 is in turn soldered to a circuit board 14. A heat sink 16 is held in place atop the electronic module 10 by means of a clamping spring 18. The ZIF socket 12 includes a locking member 20 and a base 22. The locking member 20 engages the electronic module 10, moving the electronic module along the base 22, being constrained to slide in, and opposite to, the locking direction of arrow 24. When the locking member 20 is moved in the locking direction indicated by arrow 24, the electronic module 10 is locked onto the ZIF socket 12. In FIG. 1, the apparatus is shown with the locking member 20 moved in the direction of arrow 24 to lock the module 10 in place. When the clamping spring 18 and the heat sink 10 are removed from the electronic module 10, the locking member 20 can be moved opposite the locking direction indicated by arrow 24, releasing the electronic module 10 for easy removal from the ZIF socket 12.

Figure 2:
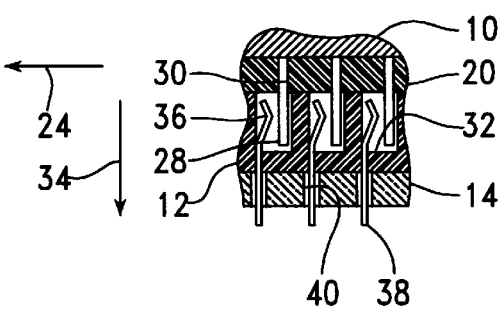
FIG. 2 is a fragmentary cross-sectional view of the apparatus of FIG. 1, taken as indicated by the section lines II—II in FIG. 1.

FIG. 2 is a fragmentary cross-sectional view of the electronic apparatus of FIG. 1, being taken as indicated by the section lines II—II in FIG. 1 to show an exemplary version of contact structures within the ZIF socket 12. Structures in this particular form, being exemplary, are not required to practice the present invention. The electronic module 10 includes a number of pins 28, each of which is inserted, through a hole 30 in the locking member 20, into a cavity 32 in the base 22, as the module is inserted into the socket 12 in the insertion direction of arrow 34. A contact spring 36 extends into each cavity 32 from an outward-extending soldertail 38, which is soldered into a hole 40 within the circuit board 14, making an electrical connection with a circuit trace (not shown) on or within the circuit board 14. In FIG. 2, the apparatus is shown in an unlocked condition, with the locking member 20 having been moved opposite the locking direction of arrow 24, so that the pins 28 are inserted through the holes 30 without contacting the springs 36. In this way, an ability to insert the module 10 into the socket 12 with "zero insertion force" is achieved. After the module 10 is inserted into the socket 12, the locking member 20 is moved in the insertion direction of arrow 24, with the pins 28 being carried in holes 30, so that each pin 28 is brought into contact with an associated adjacent contact spring 36. This movement of each pin 10 also causes the associated contact spring 36 to deflect, providing an appropriate force to assure the transmission of an electrical signal in either direction between the pin 28 and the spring 36.

Referring again to FIG. 1, after the insertion of module 10 into socket 12, the locking member 20 is moved in the locking direction of arrow 24, by first inserting the tip of a flat-bladed screwdriver (not shown) into a slot 40 within the base 22, and by then moving the handle of the screwdriver in the direction of arrow 24, so that the screwdriver, pivoting about the slot 40, acts as a lever, moving the locking member 20 in the direction of arrow 24 through contact with an engagement surface 42.

Figure 3:
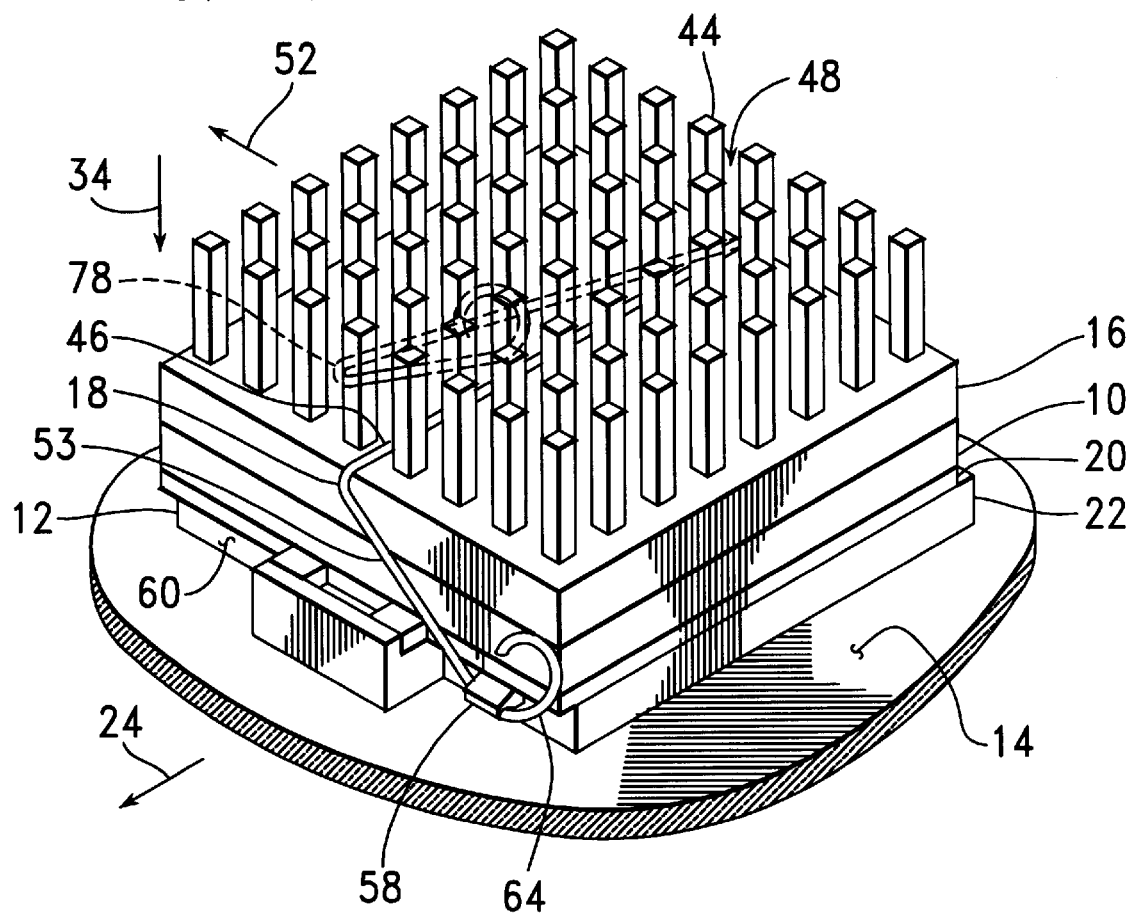
FIG. 3 is an isometric view of the apparatus of FIG. 1, as viewed from above, to the left, and in front.

FIG. 3 is an isometric view of the apparatus of FIG. 1 as viewed from above, from the left and from the front.

Referring to FIGS. 1 and 3, the dissipation of heat from the electronic module 10 is aided by means of the heat sink 16, which is held against the module 10 by means of the clamping spring 18. The heat sink 16 includes a number of upward-extending posts 44 which are particularly effective in discharging heat into the surrounding air. The clamping spring 18 includes a central portion 46, extending within a central groove 48 between adjacent pairs of posts 44, a first leg 50 extending downward, in the direction of arrow 34, and rearward, in the direction of arrow 52. The clamping spring 18 also includes a second leg 53 extending downward, in the direction of arrow 34, and forward, opposite the direction of arrow 52. The socket 12 includes a first ledge 54 extending outward from a first side 56 of housing 22 and a second ledge 58 extending outward from a second side 60 of housing 22. A first end portion 62 of first leg 50 extends under the first ledge 54, while a second end portion 64, forming a part of second leg 53, extends under the second ledge 58. In this way, opposite ends of the clamping spring 18 are held downward, so that the central portion 46 presses downward on the heat sink 16. Deflections within the clamping spring 18, including flexure within the legs 50, 53 and twisting within the central portion 46, ensure that a contact force between the heat sink 16 and the electronic module 10 is maintained, promoting the transfer of heat from the module 10 to the heat sink 16. This transfer of heat may also be promoted by the application of a layer of thermally conductive grease to lie along the interface between the heat sink 16 and the module 10.

Continuing to refer to FIG. 1, the first leg 50 of clamping spring 18 also includes an interposing portion 66, which extends within a gap 68, formed between a first surface 70 of the locking member 20 and a second surface 72 of the base 22, when the locking member 20 is moved in the locking direction of arrow 24 into a locked position in which it is shown. A reaction force between the first ledge 54 and the first end portion 62 holds the interposing portion 66 within this gap 68, so that the locking member 20 cannot be moved opposite the locking direction of arrow 24 to close the gap 68.

Assembly of this apparatus begins with the insertion of the electronic module 10 into the socket 12, with the locking member 20 being held opposite the direction of arrow 24 in the unlocked position of FIG. 2. Next, the locking member 20 is moved in the locking direction of arrow 24, into the locked position of FIG. 1. Then, the heat sink 16 is placed atop the electronic module 10. Next, the clamping spring 18 is brought into the initial position indicated by dashed lines 74, with central portion 46 extending within the central groove 48, and with the first leg 50 extending downward between the gap 68 and the first ledge 54. Then, the clamping spring 18 is moved downward, in the direction of arrow 34, while being rotated in the direction of arrow 76, so that end portion 62 is brought upward under first ledge 54 while interposing portion 66 is moved downward into gap 68.

Referring again to FIG. 3, the process described in the preceding paragraph leaves the clamping spring 18 in the intermediate position indicated by dashed lines 78. The assembly process is completed by grasping the second end portion 64, and by moving this portion 64 downward to extend below the second ledge 58. This end portion 64 is curved to facilitate being grasped in this way.

A conventional clamping spring, not built according to the present invention, lacks an interposing portion extending into a gap between the locking member and the socket housing. While a detent mechanism is conventionally provided to hold the locking member in its locked position, the force provided by such a detent mechanism can be overcome by shock and vibration forces. Such forces can be especially high in a configuration moving the pins descending from the electronic module into contact with contact springs within the socket, because both the relatively massive heat sink and the electronic module are attached to move with the locking member, and therefore to transmit shock and vibration forces to the locking member. When the shock and vibration forces sufficient to overcome detent forces, moving the locking member out of the locked position, the contact forces between pins and contact springs disappear, so that the transmission of electrical signals through the socket becomes unreliable. This type of problem is particularly serious in an environment having high levels of shock and vibration, such as a manufacturing environment.

On the other hand, apparatus built according to the present invention has the particular advantage of insensitivity to shock and vibrations. Deflections within the clamping spring 18 provide forces holding heat sink 16 in place on the electronic module 10 and holding interposing portion 66 of the clamping spring 18 in place within the gap 68, so that movement of the locking member 20 from its locked position does not occur.

While the apparatus is herein described as having a particular orientation, with references to upward, downward, forward, and rearward, it is understood that such references are made only as an example, for simplification of the descriptive language. The present invention can be practiced with the socket and heat sink in any orientation. It is further understood that the zero insertion force (ZIF) mechanism described in reference to FIG. 2 is an example of a ZIF mechanism by which the electronic module is moved so that its pins are brought into and out of contact with the contact springs of the socket. Alternative ZIF mechanisms, which are included within the scope of the present invention may move the contact springs into and out of engagement with stationary pins, may deflect the contact springs into and out of engagement with stationary pins, or may prevent the deflection of contact pins into contact with stationary pins. While the present invention has been described in its preferred forms or embodiments with some degree of particularity, it is understood that this description has been given only by way of example and that numerous changes in the details of construction, fabrication and use, including the combination and arrangement of parts may be made without departing from the spirit and scope of the invention.

What is claimed is:

1. Electronic apparatus for removably engaging a circuit module including a plurality of pins extending downward from a lower surface of said circuit module, and for cooling said circuit module, wherein said apparatus comprises:

a socket including a base and a locking member, wherein said base has a first ledge extending outward from a first side of said base, a second ledge extending outward from a second side of said base, opposite said first side thereof, a plurality of contact springs within said base, and a first interposing spring portion engaging surface, said locking member has a plurality of holes arranged for insertion therethrough of said plurality of pins, and a second interposing spring portion engaging surface, said locking member is movable on said base between a locked position and an unlocked position said plurality of holes is aligned to hold said plurality of pins extending therethrough in contact with said contact springs when said locking member is in said locked position, said plurality of holes is aligned to hold said plurality of pins out of engagement with said contact springs when said locking member is in said unlocked position, a first surface of said locking member and a second surface of said base are held in a spaced apart relationship with said locking member in said locked position, and said first surface is moved toward said second surface as said locking member is moved toward said unlocked position;

a clamping spring including a central portion, a first leg extending from a first end of said central portion, and a second leg extending from a second end of said central portion, opposite said first end thereof, wherein said first leg includes a first end portion extending under said first ledge and an interposing portion extending between said first and second interposing spring portion engaging surfaces, said second leg includes a second end portion extending under said second ledge, and a heat sink held in place atop said module, when said module is engaged with said socket, by said central portion of said clamping spring extending across and above a portion of said heat sink.

2. The electronic apparatus of claim 1, wherein said first and second legs extend in opposite directions along said first and second sides of said socket.

3. The electronic apparatus of claim 2, wherein said clamping spring is composed of a formed wire.

* * * * *